(12) United States Patent
Tsai et al.

(10) Patent No.: US 10,978,622 B2
(45) Date of Patent: Apr. 13, 2021

(54) NITRIDE PHOSPHOR AND LIGHT EMITTING DEVICE AND BACKLIGHT MODULE EMPLOYING THE NITRIDE PHOSPHOR

(71) Applicant: Lextar Electronics Corporation, Hsinchu (TW)

(72) Inventors: Yi-Ting Tsai, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/537,618

(22) Filed: Aug. 11, 2019

(65) Prior Publication Data

US 2020/0176647 A1 Jun. 4, 2020

(30) Foreign Application Priority Data

Dec. 4, 2018 (CN) .......................... 201811472669.5

(51) Int. Cl.
| | |
|---|---|
| *H01L 33/50* | (2010.01) |
| *H01L 25/075* | (2006.01) |
| *H05K 1/18* | (2006.01) |
| *H01L 33/62* | (2010.01) |
| *C09K 11/08* | (2006.01) |
| *C09K 11/77* | (2006.01) |

(52) U.S. Cl.
CPC ........ *H01L 33/504* (2013.01); *C09K 11/0883* (2013.01); *C09K 11/7734* (2013.01); *H01L 25/0753* (2013.01); *H01L 33/62* (2013.01); *H05K 1/181* (2013.01); *H01L 33/507* (2013.01); *H05K 2201/10106* (2013.01); *H05K 2201/10522* (2013.01)

(58) Field of Classification Search
CPC ... H01L 33/504; H01L 25/0753; H01L 33/62; H01L 33/507; H05K 1/181; H05K 2201/10106; H05K 2201/10522; C09K 11/0883; C09K 11/7734
USPC .......................................................... 257/89
See application file for complete search history.

(56) References Cited

U.S. PATENT DOCUMENTS

| | | | |
|---|---|---|---|
| 9,546,319 B2 | 1/2017 | Schmidt et al. | |
| 2012/0033404 A1* | 2/2012 | Wu ........................... | F21K 9/64 362/84 |
| 2015/0123155 A1* | 5/2015 | Schmidt ............. | C09K 11/7792 257/98 |
| 2016/0020366 A1 | 1/2016 | Hwang et al. | |
| 2016/0060518 A1* | 3/2016 | Hirosaki ............... | H01L 33/502 257/98 |

FOREIGN PATENT DOCUMENTS

TW I629339 B 7/2018

* cited by examiner

*Primary Examiner* — Vu A Vu
(74) *Attorney, Agent, or Firm* — CKC & Partners Co., LLC

(57) ABSTRACT

A nitride phosphor, and a light emitting device and a backlight module employing the nitride phosphor. The nitride phosphor has the formula $(Sr_{1-x}, Ba_x)LiAl_3N_{4-n}O_n$: $Eu^{3+}{}_y$, $Eu^{2+}{}_z$ with $0<x<1$ and $y/z>0.1$. The light emitting device includes a light emitting diode configured to emit a first light and the nitride phosphor configured to convert a portion of the first light to a second light. A backlight module includes a printed circuit board and a plurality of the light emitting devices.

20 Claims, 5 Drawing Sheets

NITRIDE PHOSPHOR AND LIGHT EMITTING DEVICE AND BACKLIGHT MODULE EMPLOYING THE NITRIDE PHOSPHOR

CROSS-REFERENCE TO RELATED APPLICATION

This application claims priority to China Application Serial Number 201811472669.5, filed Dec. 4, 2018, which are herein incorporated by reference in its entirety.

BACKGROUND

Field of Invention

The present disclosure relates to a nitride phosphor, and a light emitting device and a backlight module employing the nitride phosphor.

Description of Related Art

In recent years, with the gradual improvement of the luminous efficiency of light emitting diodes (LEDs) and the gradual decrease in the cost of the same, the development of modern lighting has increasingly focused on semiconductor lighting, which is recognized as a fourth generation light source after incandescent lamps, fluorescent lamps, and energy-saving lamps.

To apply semiconductor lighting to the general lighting field, it is necessary to obtain a highly efficient and high color rendering white light LED. At present, there are several ways to achieve a white light LED. A first method involves combining a red light LED chip, a green light LED chip, and a blue light LED chip to emit white light. A second method is to use an LED chip to irradiate wavelength conversion phosphors, thereby realizing white light emission. For example, a blue light LED chip may be combined with red and green phosphors, or a blue light LED chip may be combined with a yellow phosphor (e.g., YAG phosphor) to realize white light emission. However, such a method has the drawbacks of a high color temperature and a low color rendering index (CRI), and thus it cannot satisfy the demands of semiconductor lighting. Although the YAG phosphor provides a broad emission spectrum, it exhibits weak light emission intensity especially in the red wavelength region. The phenomenon of red light deficiency occurs after being blended with a blue light LED chip, which therefore affects the relevant color temperature and the color rendering index of the white light LED. Thus, while the YAG phosphor itself cannot solve the existing problem, this can be overcome by adding a red phosphor, and therefore, the red phosphor plays an important role.

Furthermore, as the requirements of a display apparatus with a broad color gamut are increased, the blue light LED, the green light LED, and the red light LED have increased product values. Compared to popular red fluorine phosphors and quantum dot materials, $SrLiAl_3N_4$ has advantages such as high temperature stability and suitable wavelength, but encounters difficulties with respect to industrial applicability because of its low luminous efficiency.

SUMMARY

Some embodiments of the present disclosure provide a nitride phosphor doped with Ba and including the coexistence of $Eu^{2+}$ and $Eu^{3+}$, which act as an activator. Thus, the nitride phosphor has a narrow FWHM which can expand a color gamut, and exhibits light emission with high intensity which is beneficial for enhancing a color rendering index and color purity, and thus can be beneficial for providing a red light emitting device with a high color rendering index. In particular, since the nitride phosphor can be irradiated by blue light, the nitride phosphor in combination with a blue light emitting diode chip and other wavelength conversion materials form a white light emitting device with a high color rendering index.

In some embodiments, a nitride phosphor has a formula of $(Sr_{1-x}, Ba_x)LiAl_3N_{4-n}O_n:Eu_{3+y}, Eu_{2+z}$, in which $0<x<1$ and $y/z>0.1$.

In some embodiments, $0.01<n<0.5$.

In some embodiments, $0.01<x<0.6$.

In some embodiments, the nitride phosphor emits light having a peak wavelength in a range from about 610 nm to about 710 nm upon being irradiated by light having a peak wavelength in a range from about 400 nm to about 500 nm.

In some embodiments, a light emitting device includes a light emitting diode configured to emit a first light and a nitride phosphor configured to convert a portion of the first light to a second light, in which the nitride phosphor has the formula of $(Sr_{1-x}, Ba_x)LiAl_3N_{4-n}O_n:Eu_{3+y}, Eu_{2+z}$, in which $0<x<1$ and $y/z>0.1$.

In some embodiments, $0.01<n<0.5$.

In some embodiments, $0.01<x<0.6$.

In some embodiments, a peak wavelength of the first light is in a range from about 400 nm to about 500 nm, and a peak wavelength of the second light is in range from about 610 nm to about 710 nm.

In some embodiments, the light emitting device further includes a wavelength conversion material. A composition of the wavelength conversion material is different from a composition of the nitride phosphor.

In some embodiments, the wavelength conversion material includes phosphors, quantum dots, or combinations thereof.

In some embodiments, the wavelength conversion material includes green phosphors, green quantum dots, or combinations thereof.

In some embodiments, the wavelength conversion material includes a $Mn^{4+}$-activated fluoride phosphor, $Eu^{2+}$-activated CaAlSiN3, $Eu^{2+}$-activated $(Sr,Ca)AlSiN_3$, or combinations thereof.

In some embodiments, the wavelength conversion material includes green phosphors, green quantum dots, or combinations thereof.

In some embodiments, the wavelength conversion material includes yellow phosphors.

In some embodiments, a backlight module includes a printed circuit board and a plurality of the abovementioned light emitting devices on the printed circuit board.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
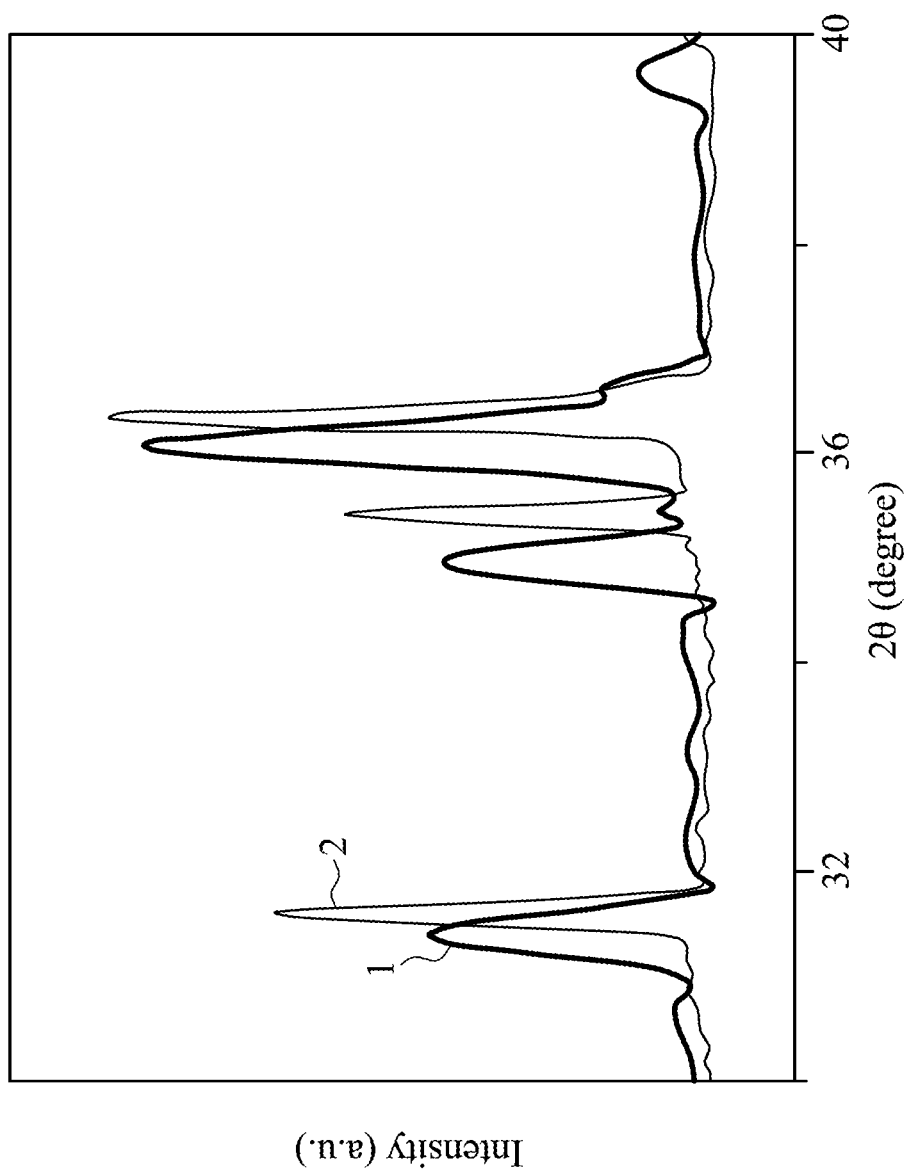
FIG. 1 is a graph of X-ray diffraction (XRD) patterns for a number of nitride phosphors according to one embodiment.

Reference will now be made in detail to the present embodiments of the invention, examples of which are illustrated in the accompanying drawings. Wherever possible, the same reference numbers are used in the drawings and the description to refer to the same or like parts.

A nitride phosphor according to one embodiment of the present disclosure has a formula of $(Sr_{1-x}, Ba_x)LiAl_3N_{4-n}O_n$:$Eu^{3+}_y$, $Eu^{2+}_z$, in which $0<x<1$ and $y/z>0.1$, in which $0.01<n<0.5$, and $0.01<x<0.6$, and in which $Eu^{2+}$ and $Eu^{3+}$ act as an activator and coexist in the nitride phosphor. X-ray diffraction (XRD) pattern analysis is used to identify a crystal structure of the nitride phosphor of the present embodiment and the result is shown in FIG. 1. A curve 1 shown in FIG. 1 is the XRD pattern of the nitride phosphor of the present embodiment. A curve 2 shown in FIG. 1 is the XRD pattern of the Eu-activated phosphor, SrLiAl$_3$N$_4$:Eu, which has X-ray diffraction reflection at diffraction angles of 2θ=30 degrees, 35 degrees, and 36.5 degrees. As confirmed from FIG. 1, the diffraction angles of the nitride phosphor of the present embodiment are about the same as the Eu-activated phosphor, SrLiAl$_3$N$_4$:Eu, and slightly shifted left to lower diffraction angles, which indicates that the Eu-activated phosphor, SrLiAl$_3$N$_4$:Eu and the nitride phosphor of the present embodiment have the same crystal structures and different lattice spacings. In particular, it is confirmed that the nitride phosphor of the present embodiment includes $(Sr_{1-x}, Ba_x)$ substituted for Sr in the crystal structure. In other words, it is confirmed that the nitride phosphor of the present embodiment is doped with Ba.

Figure 2:
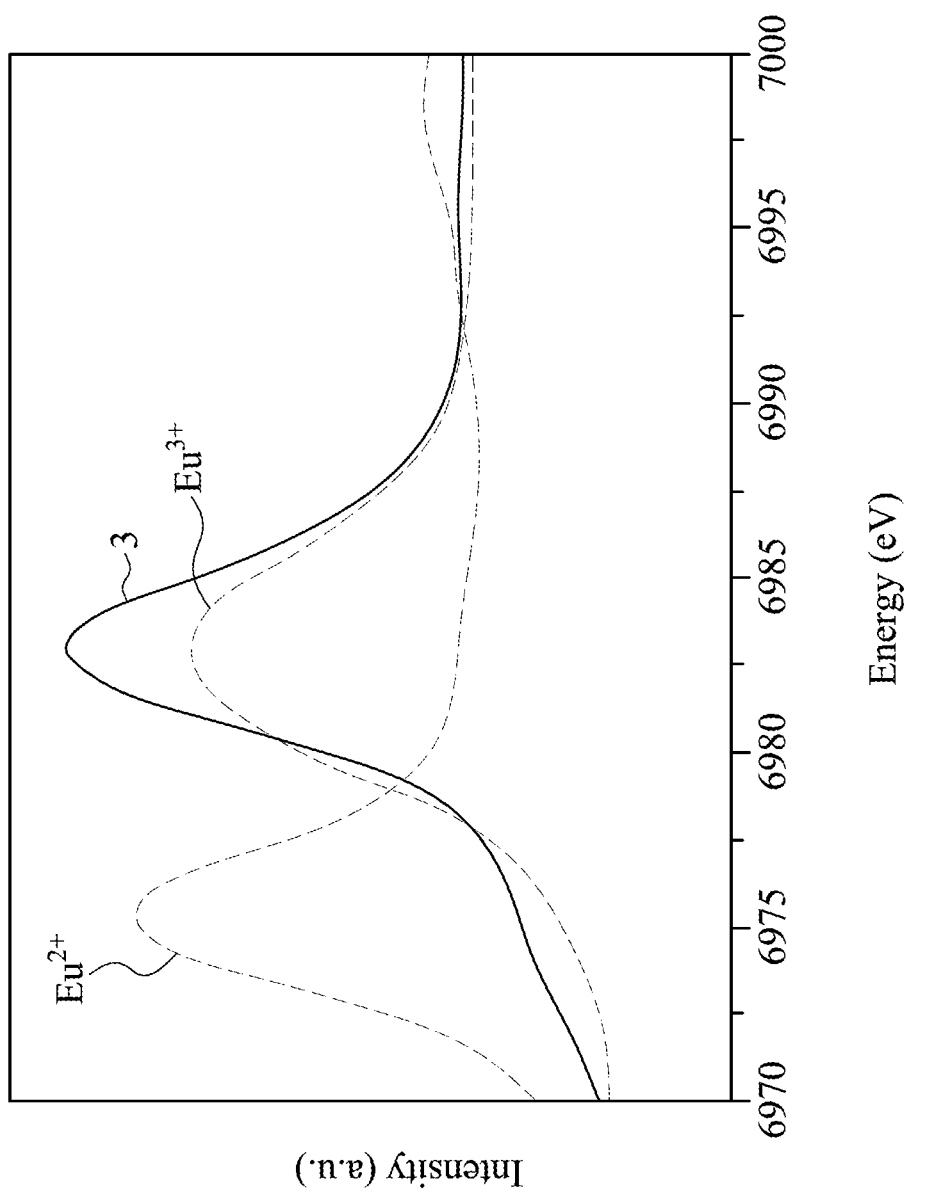
FIG. 2 is an X-ray absorption near edge structure (XANES) spectrum of Eu-$L_3$ absorption edge.

X-ray Absorption Near Edge Structure (XANES) analysis is used to analyze the valency of the Eu of the nitride phosphor of the present embodiment, and the result is shown in FIG. 2. The ratio of $Eu^{2+}$ and $Eu^{3+}$ of the nitride phosphor of the present embodiment can be quantified, for example, by measuring the Eu-$L_3$ absorption edge XANES spectrum. XANES is a kind of an analysis method of X-ray absorption fine structure (XAFS) measurement methods. It is known that strong absorption peak energy which appears in $L_3$ absorption edge XANES spectrum of a rare-earth element is determined by the valency of the rare-earth, and in the case of Eu, the peak for $Eu^{2+}$ appears around 6975 eV, and the peak for $Eu^{3+}$ appears around 6984 eV, and therefore the ratio can be quantified by separating these two. The obtained Eu-$L_3$ absorption edge XANES spectrum was normalized by subtracting the background of the energy side lower than the absorption peak (pre-edge region), and adjusting the strength of the background intensity of the energy side higher than the absorption peak (post-edge region) to 1. A curve 3 shown in FIG. 2 shows the spectrum of the nitride phosphor of the present embodiment which includes strong absorption peak energy for $Eu^{2+}$ and $Eu^{3+}$. This indicates that Eu present in the nitride phosphor has two ionic states, $Eu^{2+}$ and $Eu^{3+}$, which coexist therein.

Figure 3:
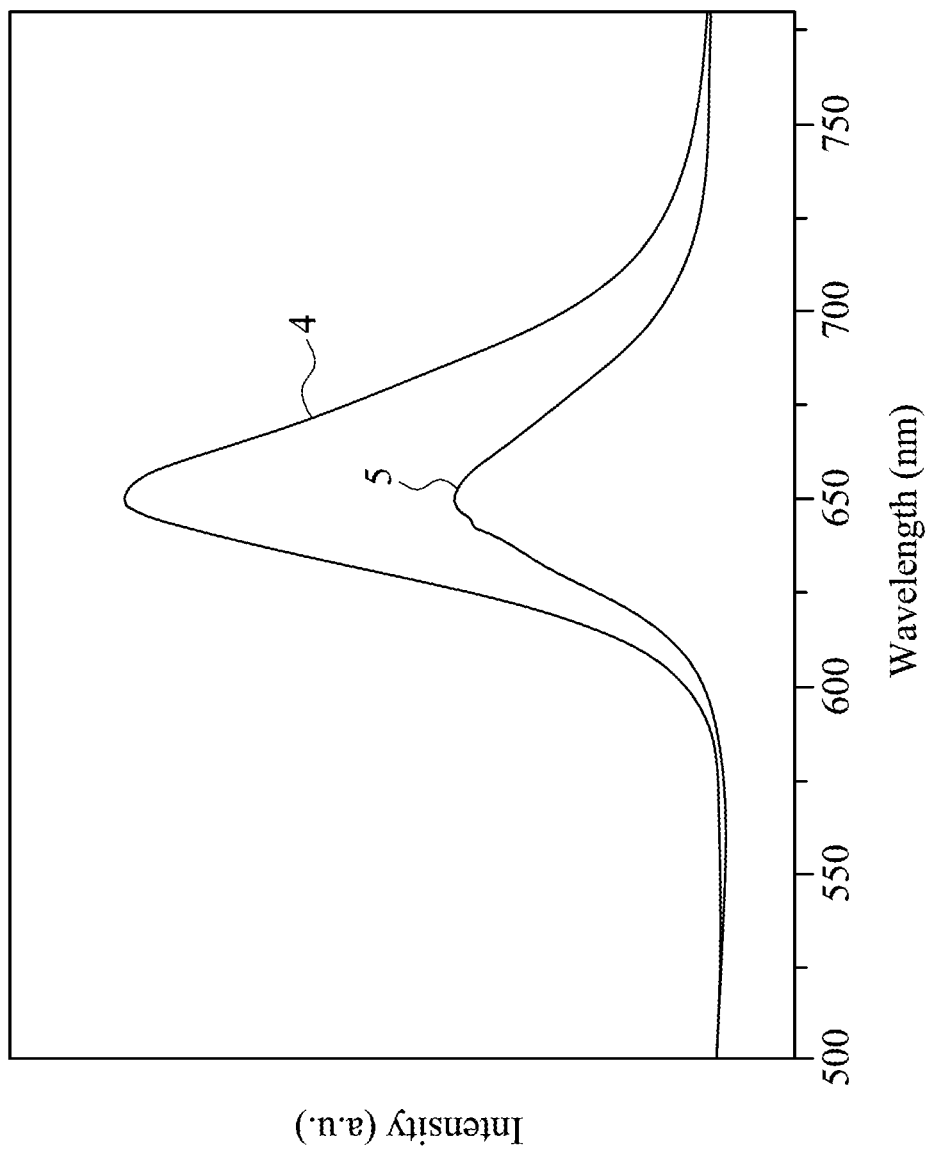
FIG. 3 is a fluorescence spectrogram of the nitride phosphor according to some embodiments.

FIG. 3 is a fluorescence spectrogram of the nitride phosphor and the Eu-activated phosphor, SrLiAl$_3$N$_4$:Eu, according to the present embodiment. In FIG. 3, a curve 4 is the fluorescence spectrogram of the nitride phosphor of the present embodiment, and a curve 5 is the fluorescence spectrogram of the Eu-activated phosphor, SrLiAl$_3$N$_4$:Eu. The nitride phosphor and Eu-activated phosphor, SrLiAl$_3$N$_4$:Eu, emit light having a peak wavelength in a range from about 610 nm to about 710 nm upon irradiation with light having a peak wavelength in a range from about 400 nm to about 500 nm. In other words, the nitride phosphor and the Eu-activated phosphor, SrLiAl$_3$N$_4$:Eu emit red light upon irradiation with blue light. As shown in FIG. 3, the nitride phosphor of the present embodiment has the fluorescence spectrogram with a full width at half maximum (FWHM) narrower than a full width at half maximum of the fluorescence spectrogram of the Eu-activated phosphor, SrLiAl$_3$N$_4$:Eu, which is beneficial for providing a broad color gamut. The light emission intensity of the nitride phosphor of the present embodiment is greater than the light emission intensity of the Eu-activated phosphor, SrLiAl$_3$N$_4$:Eu, which is beneficial for enhancing the color rendering index and color purity, and thus can provide a red light emitting device with a high color rendering index. Since the nitride phosphor of the present embodiment can be irradiated by blue light, the nitride phosphor in combination with a blue light emitting diode chip and a green light wavelength conversion material form a white light emitting device with a high color rendering index.

Figure 4:
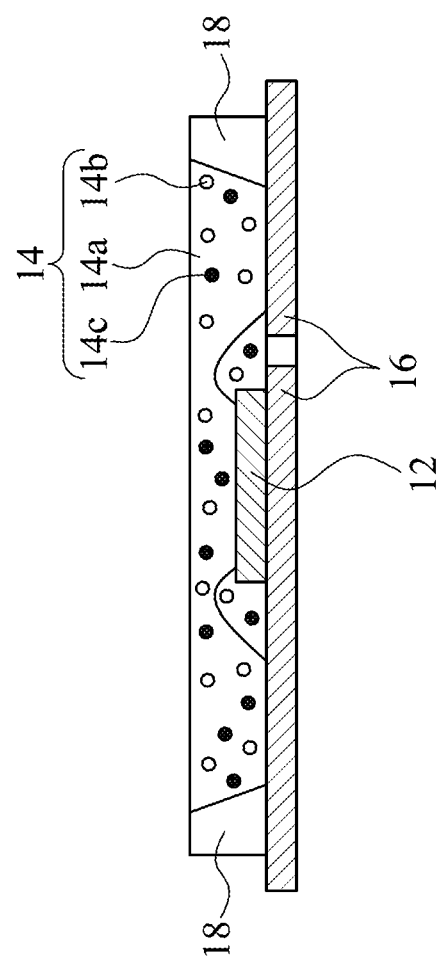
FIG. 4 is a cross-sectional view of a light emitting device according to one embodiment.

FIG. 4 shows a light emitting device 10 in accordance with some embodiments. The light emitting device 10 includes a light emitting diode chip 12, a wavelength conversion layer 14, a lead frame 16, and a reflective wall 18. The wavelength conversion layer 14 is over the light emitting diode chip 12. The reflective wall 18 surrounds the light emitting diode chip 12. The light emitting diode chip 12 is configured to emit a first light. The light emitting diode chip 12 can be electrically connected to the lead frame 16 through a wire bonding technique, as shown in FIG. 4. In some other embodiments, the light emitting diode chip 12 can be electrically connected to the lead frame 16 through a flip chip bonding technique. The wavelength conversion layer 14 includes a transparent colloid 14a and a nitride phosphor 14b mixed therein. The nitride phosphor 14b includes at least the nitride phosphor having a formula of $(Sr_{1-x}, Ba_x)LiAl_3N_{4-n}O_n$:$Eu^{3+}_y$, $Eu^{2+}_z$ according to the abovementioned embodiment. The nitride phosphor 14b is configured to convert a portion of the first light into a second light. For example, in some embodiments, the light emitting diode chip 12 is a blue light emitting diode chip and emits the first light having a peak wavelength in a range from about 400 nm to about 500 nm. The nitride phosphor 14b converts the first light into the second light. The second light has a peak wavelength in a range from about 610 nm to about 710 nm. Therefore, the light emitting device 10 can emit red light, and a red emitting device with a high color rendering index is achieved. The transparent colloid 14a may include polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, silicone, the like, or combinations thereof.

In some other embodiments, in addition to the nitride phosphor 14b (e.g., the nitride phosphor having the formula of $(Sr_{1-x}, Ba_x)LiAl_3N_{4-n}O_n$:$Eu^{3+}_y$, $Eu^{2+}_z$ in accordance of the abovementioned embodiment), the wavelength conversion layer 14 further includes a wavelength conversion material 14c having a composition different from a composition of the nitride phosphor 14b mixed therein. For example, the wavelength conversion material 14c can be other phosphors, quantum dots, the like, or combinations thereof. The wavelength conversion material 14c is selected depending on the desired emission light of the light emitting device 10. In one embodiment, the light emitting device 10 emits white light, and the wavelength conversion material 14c includes green phosphors, green quantum dots, the like, or combinations thereof and is configured to convert a portion of the first light into a third light. The wavelength of the third light is in a range from about 480 nm to about 560 nm. Therefore, by the mixture of the first light emitted by the light emitting diode chip 12, the second light, and the third light, the light emitting device 10 can emit white light. Therefore, a white light emitting device with a high rendering index can be achieved. Green phosphors may include, but is not limited to, μ-SiAlON ($Si_{6-z}Al_zO_zN_{8-z}$:$Eu^{2+}$), silicate phosphor, the like, or combinations thereof. The green quantum dots can include, but is not limited to, CdSe, $CsPb(Br_{1-b}I_b)_3$, in which 0≤b≤0.5, the like, or combinations thereof.

In some other embodiments, the wavelength conversion layer 14 includes two or more wavelength conversion materials which emit red light. In other words, in addition to the nitride phosphor 14b (e.g., the nitride phosphor having the formula of $(Sr_{1-x}, Ba_x)LiAl_3N_{4-n}O_n$:$Eu^{3+}_y$, $Eu^{2+}_z$ in accordance with the abovementioned embodiment), the wavelength conversion layer 14 includes the wavelength conversion material 14c which includes other red phosphors, red quantum dots, the like, or combinations thereof. The red phosphors include $Mn^{4+}$-activated fluoride phosphor, $Eu^{2+}$-activated $CaAlSiN_3$ (CASN), $Eu^{2+}$-activated $(Sr,Ca)AlSiN_3$ (SCASN), the like or combinations thereof. $Mn^{4+}$-activated fluoride phosphor has a formula of $A_2[MF_6]$:$Mn^{4+}$, in which A is Li, Na, K, Rb, Cs, $NH_4$, or a combination thereof, and M is Ge, Si, Sn, Ti, Zr, or a combination thereof. CASN phosphor can be irradiated by the blue light emitting diode chip and then emit red light having a peak wavelength of about 650 nm. SCASN phosphor can be irradiated by the blue light emitting diode chip and then emit red light having a peak wavelength in a range from about 620 nm to about 660 nm. The $Mn^{4+}$-activated fluorine phosphor can be irradiated by the blue light emitting diode chip and then emit red light having a peak wavelength in a range from about 600 nm to about 650 nm. $Mn^{4+}$-activated $K_2SiF_6$ (KSF) is usually applied to a backlight module of a display apparatus. However, the attenuation time of the emitted light of the KSF phosphor is long, for example, greater than about 10 ms. Such a long attenuation time may cause an afterglow of the red light to exist in the display apparatus. The attenuation time of the emitted light of the nitride phosphor 14b (e.g., the nitride phosphor having the formula of $(Sr_{1-x}, Ba_x)LiAl_3N_{4-n}O_n$:$Eu^{3+}$, $Eu^{2+}_z$ in accordance with the abovementioned embodiment) is short, for example, about 1/10000 to 1/1000 of the attenuation time of the emitted light of the KSF phosphor. Therefore, a blend of the nitride phosphor 14b and the KSF phosphor can reduce an afterglow issue caused by the KSF phosphor. CASN and SCASN phosphors can be blended in the nitride phosphor 14b as well to provide a high color rendering index for illumination applications. In particular, except for the two or more wavelength conversion materials which emit red light, the wavelength conversion layer further includes green phosphors, green quantum dots, the like, or combinations thereof such that the light emitting device 10 can emit white light. The materials of the green phosphors and the green quantum dots are similar to abovementioned green phosphors and the green quantum dots, and an explanation of the materials is not repeated herein.

In some other embodiments, the wavelength conversion material 14c can include yellow phosphors (e.g., YAG phosphor which can emit yellow light having a wavelength in a range from about 550 nm to about 560 nm upon irradiation with a blue light emitting diode chip) which in combination with the nitride phosphor 14b (e.g., the nitride phosphor having the formula of $(Sr_{1-x}, Ba_x)LiAl_3N_{4-n}O_n$:$Eu^{3+}_y$, $Eu^{2+}_z$ according to the abovementioned embodiment) can provide the light emitting device 10 which can emit white light with a high color rendering index.

It is to be understood that the configuration and illustration of the abovementioned light emitting device 10 is merely one example embodiment and the claimed subjected matter is not limited in scope thereto. One of ordinary skill in the art would recognize other variations, modifications, and alternatives.

Figure 5:
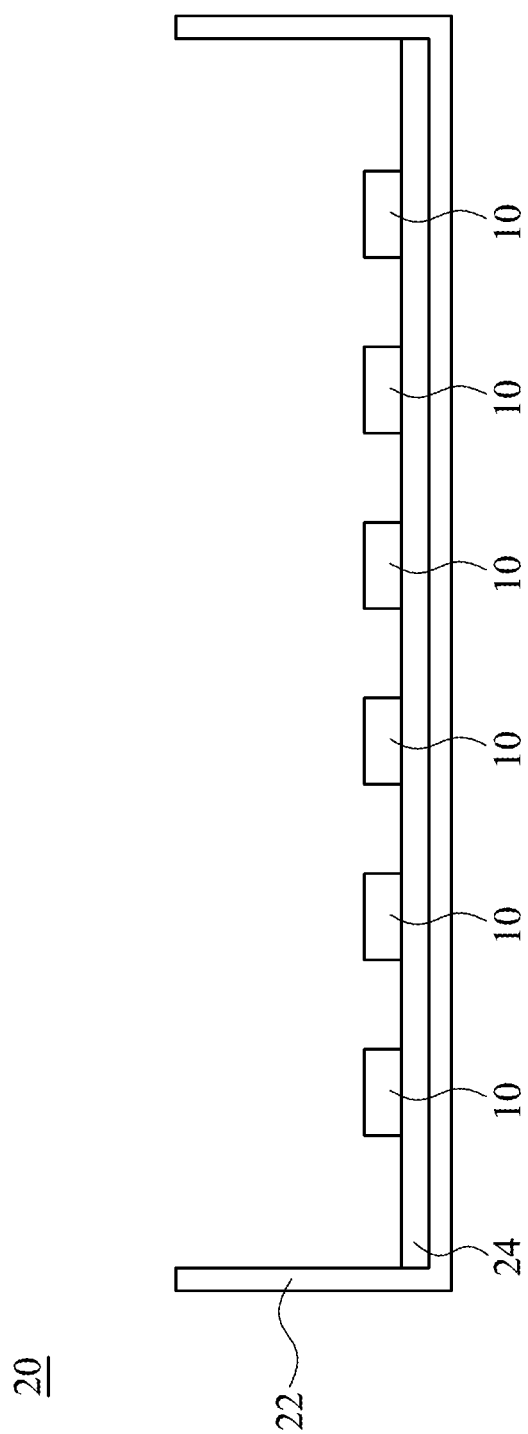
FIG. 5 is a cross-sectional view of a backlight module according to one embodiment.

FIG. 5 shows a backlight module 20 in accordance with some embodiments. The backlight module 20 includes a plurality of the abovementioned light emitting devices 10, a frame 22, and a printed circuit board 24. The printed circuit board 24 is disposed on the frame 22. The light emitting devices 10 are electrically connected to the printed circuit board 24. In some other embodiments, the light emitting devices 10 can be covered by a lens (not shown) to achieve a wide angle light emission.

The nitride phosphor according to the abovementioned embodiment is not limited to applications of the foregoing light emitting device 10 or the backlight module 20, and may be applied in other products using phosphors. For example, the nitride phosphor according to the abovementioned embodiments may be applied in a wavelength converting element, a photovoltaic conversion device, such as a light emitting diode package, a quantum dot light emitting diode (QLED), a plant illumination device, a solar cell, a bio label, an image sensor, etc.

The nitride phosphor 14b is doped with Ba and includes the coexistence of $Eu^{2+}$ and $Eu^{3+}$, which act as an activator. Thus, the nitride phosphor has narrow FWHM which can expand a color gamut, and has light emission with high intensity which is beneficial for enhancing a color rendering index and color purity, and thus can be beneficial for providing a red light emitting device with a high color rendering index. In particular, since the nitride phosphor can be irradiated by blue light, the nitride phosphor in combination with a blue light emitting diode chip and other wavelength conversion materials form a white light emitting device with a high color rendering index.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A nitride phosphor having a formula of $(Sr_{1-x}, Ba_x)LiAl_3N_{4-n}O_n$:$Eu^{3+}_y$, $Eu^{2+}_z$ and having a crystal structure same as a crystal structure of $SrLiAl_3N_4$:Eu,
   wherein 0<x<1 and y/z>0.1.
2. The nitride phosphor of claim 1, wherein 0.01<n<0.5.
3. The nitride phosphor of claim 1, wherein 0.01<x<0.6.
4. The nitride phosphor of claim 1, wherein the nitride phosphor emits light having a peak wavelength in a range from about 610 nm to about 710 nm upon being irradiated by light having a peak wavelength in a range from about 400 nm to about 500 nm.

5. A light emitting device, comprising:
a light emitting diode configured to emit a first light; and
a nitride phosphor configured to convert a portion of the first light to a second light, wherein the nitride phosphor has the formula of $(Sr_{1-x}, Ba_x)LiAl_3N_{4-n}O_n, Eu^{3+}{}_y, Eu^{2+}{}_z$ and has a crystal structure same as a crystal structure of $SrLiAl_3N_4:Eu$, wherein $0<x<1$ and $y/z>0.1$.

6. The light emitting device of claim 5, wherein $0.01<n<0.5$.

7. The light emitting device of claim 5, wherein $0.01<x<0.6$.

8. The light emitting device of claim 5, wherein a peak wavelength of the first light is in a range from about 400 nm to about 500 nm, and a peak wavelength of the second light is in range from about 610 nm to about 710 nm.

9. The light emitting device of claim 8, further comprising a wavelength conversion material, wherein a composition of the wavelength conversion material is different from a composition of the nitride phosphor.

10. The light emitting device of claim 9, wherein the wavelength conversion material includes phosphors, quantum dots, or combinations thereof.

11. The light emitting device of claim 9, wherein the wavelength conversion material includes green phosphors, green quantum dots, or combinations thereof.

12. The light emitting device of claim 9, wherein the wavelength conversion material includes a $Mn^{4+}$-activated fluoride phosphor, $Eu^{2+}$-activated $CaAlSiN_3$, $Eu^{2+}$-activated $(Sr,Ca)AlSiN_3$, or combinations thereof.

13. The light emitting device of claim 12, wherein the wavelength conversion material includes green phosphors, green quantum dots, or combinations thereof.

14. The light emitting device of claim 9, wherein the wavelength conversion material includes yellow phosphors.

15. A backlight module, comprising:
a printed circuit board; and
a plurality of the light emitting devices according to claim 5 on the printed circuit board.

16. The backlight module of claim 15, wherein $0.01<n<0.5$.

17. The backlight module of claim 15, wherein $0.01<x<0.6$.

18. The backlight module of claim 15, wherein a peak wavelength of the first light is in a range from about 400 nm to about 500 nm, and a peak wavelength of the second light is in range from about 610 nm to about 710 nm.

19. The backlight module of claim 18, further comprising a wavelength conversion material, wherein a composition of the wavelength conversion material is different from a composition of the nitride phosphor.

20. The backlight module of claim 19, wherein the wavelength conversion material includes phosphors, quantum dots, or combinations thereof.

* * * * *